US012622191B2

(12) United States Patent
Huang et al.

(10) Patent No.: US 12,622,191 B2
(45) Date of Patent: *May 5, 2026

(54) METHOD FOR ION IMPLANTATION THAT ADJUSTS A TARGET'S TILT ANGLE BASED ON A DISTRIBUTION OF EJECTED IONS FROM A TARGET

(71) Applicant: TAIWAN SEMICONDUCTOR MANUFACTURING CO., LTD., Hsinchu (TW)

(72) Inventors: Chun-Jung Huang, Tuku Township (TW); Li-Hsin Chu, New Taipei City (TW); Po-Feng Tsai, Taipei City (TW); Henry Peng, Hsinchu (TW); Kuang Huan Hsu, Hsinchu City (TW); Tsung Wei Chen, New Taipei City (TW); Yung-Lin Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/753,697

(22) Filed: Jun. 25, 2024

(65) Prior Publication Data

US 2024/0347341 A1 Oct. 17, 2024

Related U.S. Application Data

(60) Continuation of application No. 18/126,861, filed on Mar. 27, 2023, now Pat. No. 12,051,593, which is a
(Continued)

(51) Int. Cl.
*H01L 21/265* (2006.01)
*C23C 14/48* (2006.01)
(Continued)

(52) U.S. Cl.
CPC ........ *H01L 21/26586* (2013.01); *C23C 14/48* (2013.01); *C23C 14/54* (2013.01); *H01L 22/14* (2013.01)

(58) Field of Classification Search
CPC ... H01L 21/26586; H01L 22/14; C23C 14/48; C23C 14/54; C23C 14/505; H01J 37/3171; H01J 37/1478; H01J 37/3002
See application file for complete search history.

(56) References Cited

U.S. PATENT DOCUMENTS 6,169,015 B1 * 1/2001 Fu-Kang ............... H01J 37/304
438/510
6,437,350 B1 * 8/2002 Olson ................. H01J 37/3171
250/492.2
(Continued)

FOREIGN PATENT DOCUMENTS

| CN | 102324383 A | 1/2021 |
| TW | 1286775 B | 9/2007 |
| TW | 200818280 A | 4/2008 |

*Primary Examiner* — Ermias T Woldegeorgis
(74) *Attorney, Agent, or Firm* — Sterne, Kessler, Goldstein and Fox P.L.L.C.

(57) ABSTRACT

The present disclosure describes a system and a method for an ion implantation (IMP) process. The system includes an ion implanter configured to scan an ion beam over a target for a range of angles, a tilting mechanism configured to support and tilt the target, an ion-collecting device configured to collect a distribution and a number of ejected ions from the ion beam scan over the target, and a control unit configured to adjust a tilt angle based on a correction angle determined based on the distribution and number of ejected ions.

20 Claims, 7 Drawing Sheets

Related U.S. Application Data continuation of application No. 17/529,504, filed on Nov. 18, 2021, now Pat. No. 11,615,961, which is a division of application No. 16/381,863, filed on Apr. 11, 2019, now Pat. No. 11,195,720.

(60) Provisional application No. 62/752,268, filed on Oct. 29, 2018.

(51) Int. Cl.
    C23C 14/54     (2006.01)
    H01L 21/66     (2006.01)

(56)         References Cited

U.S. PATENT DOCUMENTS

| | | | |
|---|---|---|---|
| 6,555,832 | B1 | 4/2003 | Ryding et al. |
| 8,575,544 | B1 | 11/2013 | Kelly et al. |
| 11,195,720 | B2 | 12/2021 | Huang et al. |
| 2004/0065849 | A1 | 4/2004 | Larsen |
| 2005/0230642 | A1* | 10/2005 | Halling ............... H01J 37/3171 |
| | | | 250/492.21 |
| 2008/0078952 | A1 | 4/2008 | Gupta et al. |
| 2009/0314959 | A1 | 12/2009 | Gammel et al. |
| 2014/0227453 | A1 | 8/2014 | Wang et al. |

* cited by examiner

500

510

Preparing a target

520

Performing an IMP process on the target

600

610

Scanning an ion beam over a target for a range of angles

620

Collecting a distribution and a number of ejected ions

630

Determining a correction angle based on the distribution and number of ejected ions

640

Adjusting a tilt angle of the target based on the correction angle

METHOD FOR ION IMPLANTATION THAT ADJUSTS A TARGET'S TILT ANGLE BASED ON A DISTRIBUTION OF EJECTED IONS FROM A TARGET

CROSS-REFERENCE TO RELATED APPLICATIONS

This application is a continuation of U.S. Non-provisional patent application Ser. No. 18/126,861 titled "Method for Ion Implantation that Adjusts a Target's Tilt Angle Based on a Distribution of Ejected Ions From a Target," filed on Mar. 27, 2023, which is a continuation of U.S. Non-provisional patent application Ser. No. 17/529,504 titled "Method for Ion Implantation that Adjusts a Target's Tilt Angle Based on a Distribution of Ejected Ions from a Target," filed on Nov. 18, 2021, which is a divisional of U.S. Non-provisional patent application Ser. No. 16/381,863, titled "Method for Ion Implantation that Adjusts a Target's Tilt Angle Based on a Distribution of Ejected Ions from a Target," filed on Apr. 11, 2019, which claims priority to and the benefit of U.S. Provisional Patent Application No. 62/752,268, titled "Ion Implantation Apparatus and Method," filed on Oct. 29, 2018. The entire contents of the aforementioned applications are incorporated by reference herein in their entireties.

BACKGROUND

Ion implantation (IMP) is widely used in semiconductor fabrication for creating regions of various dopant concentrations/levels. In an IMP process, ions are accelerated to bombard a solid target (e.g., substrate or film), thereby changing the properties (e.g., physical, chemical, and/or electrical properties) of the target. For example, in a complementary metal-oxide semiconductor (CMOS) device, regions of different dopant concentrations can be formed by IMP.

Ions can be accelerated to impinge the target from various directions, depending on, e.g., the shape and the depth of the doped region. For example, ions can be implanted into the target at an implantation angle theta (θ, the angle between the target surface normal and the ion beam) and a suitable energy so the ions can be implanted within a desired depth/location range.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
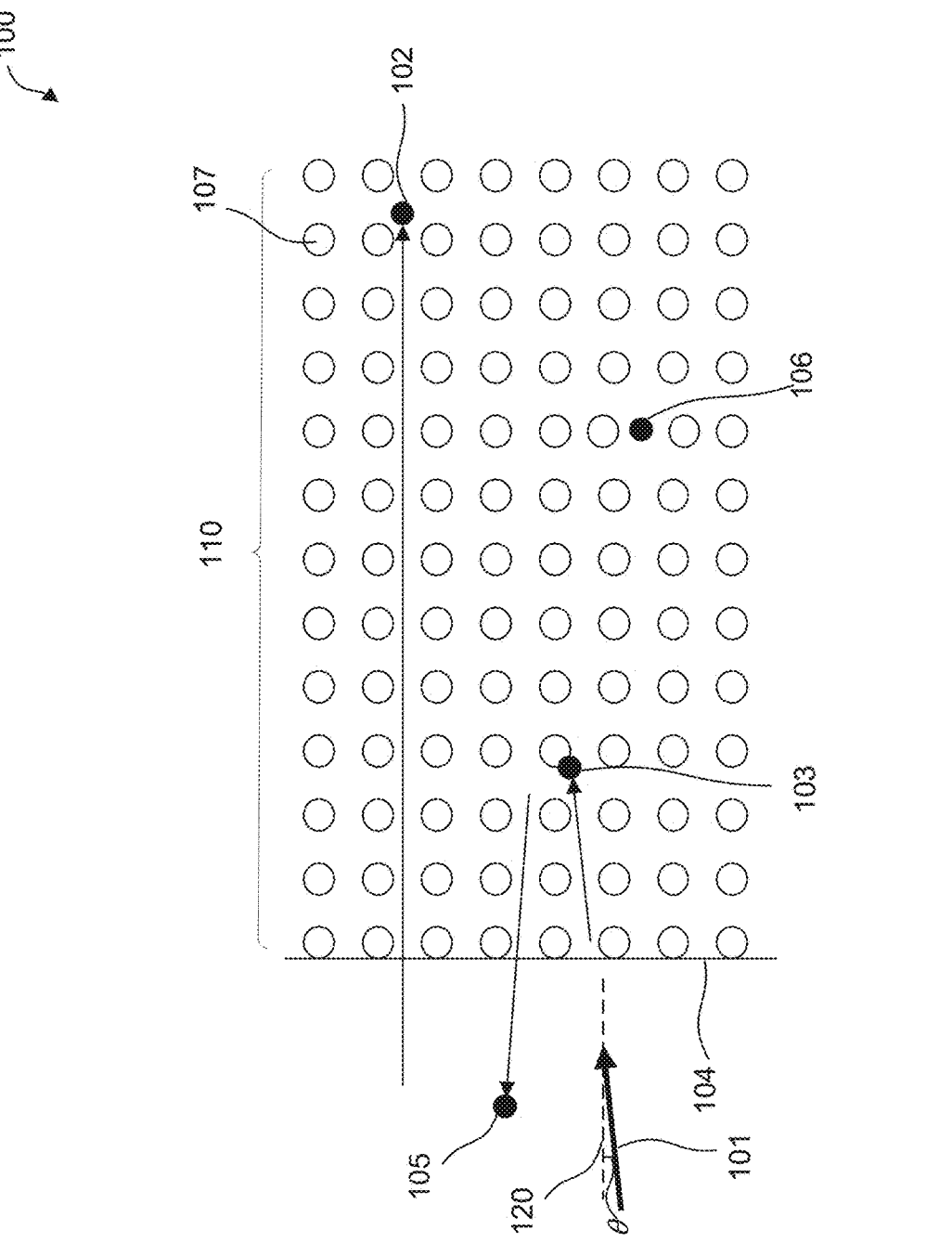
FIG. 1 illustrates an IMP process.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

Ion implantation is widely used in semiconductor fabrication to form regions doped with desired ions (in a device or structure) to alter the chemical, physical, and/or electrical properties of the regions. In an IMP process, accelerated ions impinge a region of a substrate so these ions can be implanted into the substrate as dopants at desired locations/depths. These dopants can enable the device or structure to have desired properties, which are essential for various applications. For example, source and drain regions of a CMOS device are doped with dopants that have an opposite polarity than the substrate, and allow the CMOS device to be turned on and off with a gate voltage. The source and drain regions can be formed by performing IMPs on the substrate.

In an IMP process, ions can be implanted into the substrate at a tilt angle of, e.g., about 0 degrees to about 15 degrees. The tilt angle refers to the angle between the direction of the ions and the surface normal of the substrate. The IMP process can form regions doped with the implanted ions (e.g., dopants). Ideal/theoretical values of parameters, such as the ion species, ion energy, the ion dosages, and the tilt angle of ions, can be written into, e.g., a recipe, which is executed by an ion implanter when performing the IMP process. These parameters can be used to determine the trajectory of ions when they are doped into the substrate and the theoretical (e.g., ideal or desired) doping profile (e.g., the point-to-point dopant concentration in the substrate) of the dopants. The dopants can be distributed within a desired depth range under the top surface of the substrate.

However, various factors (e.g., atom arrangement, ion species, ion energy, and/or equipment error) can cause the doped ions to change trajectory and the actual doping profile to deviate from the theoretical doping profile. For example, for some atom arrangements, when the actual tilt angle is less than the theoretical tilt angle, ions can be less susceptible to collide with atoms of the substrate, and can be implanted deeper into the substrate. Accordingly, the doped region can be more susceptible to channeling effect, which involves ions penetration through the substrate/doped region. For some atom arrangements, when the actual title angle is greater than the theoretical tilt angle, ions are more susceptible to collide with the atoms of the substrate, causing the ions to be ejected from the substrate. As a result, deviation from the theoretical tilt angle can cause a doping profile different than the theoretical design. Furthermore, channeling effect can cause damage to the doped region or the substrate, thus causing low yield of the fabricated device/structure.

FIG. 1 illustrates trajectories of different ions in an IMP process 100. As shown in FIG. 1, an ion beam 101 is produced by an ion source or an accelerator (not shown) and contains accelerated ions (e.g., primary ions) of high energy for bombarding a target 110 on a target surface 104. Target 110 can represent any suitable solid material and include a plurality of atoms 107. Ions of ion beam 101 can travel in atoms 107 of target 110 after being implanted into target 110. For example, ion 103 represents an ion colliding with an atom 107, ion 105 represents an ion being ejected after colliding with atoms 107, ion 106 represents an ion being implanted in atoms 107, and ion 102 represents a channeling ion penetrating through atoms 107 of target 110. Ion 102 can cause a channeling effect in target 110. Tilt angle $\theta$ represents the angle between ion beam 101 and surface normal 120 of surface 104. Arrows in FIG. 1 represent the paths/ trajectories of ions. Ion beam 101 can impinge target surface 104 from various directions, and ions (e.g., primary ions) can be implanted or ejected, depending on the tilt angle $\theta$, the orientation of angles, etc. Ion beam 101 can be incident on target surface 104 at tilt angle $\theta$ of about 0 degrees to about 15 degrees. The ejected ions can be referred to as "secondary ions."

As shown in FIG. 1, after being implanted in target 110, primary ions can be implanted among atoms 107 (e.g., ion 106), or can collide with atoms 107 and ejected out of target 110 (e.g., ion 103). Primary ions can also penetrate layers of atoms 107, "channeling" target 110. In some embodiments, a desired tilt angle $\theta$ can result in a minimized number (e.g., zero) of ions 103 and ions 102. However, a deviation from the preferred tilt angle $\theta$ during the IMP process can cause an increased number of ions 102 and/or ions 103, resulting in the actual doping profile to differ from the theoretical doping profile. Especially, ions 103 can cause damage in target 110. Thus, optimizing the tilt angle in an IMP process for a target/layer can decrease the number of ejected ions and channeling ions. The target can thus be less susceptible to damage and deviation from the desired doping profile.

The present disclosure provides an IMP apparatus and a method using the IMP apparatus to optimize the tilt angle of an IMP process. The IMP apparatus and method can also reduce the number of ejected ions and suppress channeling effect in an IMP process, improving the control over implantation dosage and/or implantation depths of ions. The apparatus and method can improve the doping accuracy under various implantation conditions (e.g., various ion species, various atom arrangements in the target, and/or various ion energy). Embodiments of the present disclosure can be employed in implanting various materials and materials with various atom arrangements. The disclosed IMP apparatus employs an ion-collecting device that collects and records the species, number, and distribution of ion ejected from the target (e.g., secondary ions). The recorded data of these ions can be sent to a control unit/device, which calculates the tilt angle deviation based on the recorded data. The control unit/device can also correct the tilt angle of the target to reduce or eliminate the deviation so the number of ejected ions and channeling ions can be minimized. A benefit of using the disclosed IMP apparatus and method, among others, includes the improvement of IMP precision and quality for various IMP conditions, and reduction/prevention of ejected ions, channeling ions, and substrate damage during IMP processes. Thus, for each IMP condition and/or target condition, an optimized tilt angle can be determined to form a desired doping profile.

Figure 2:
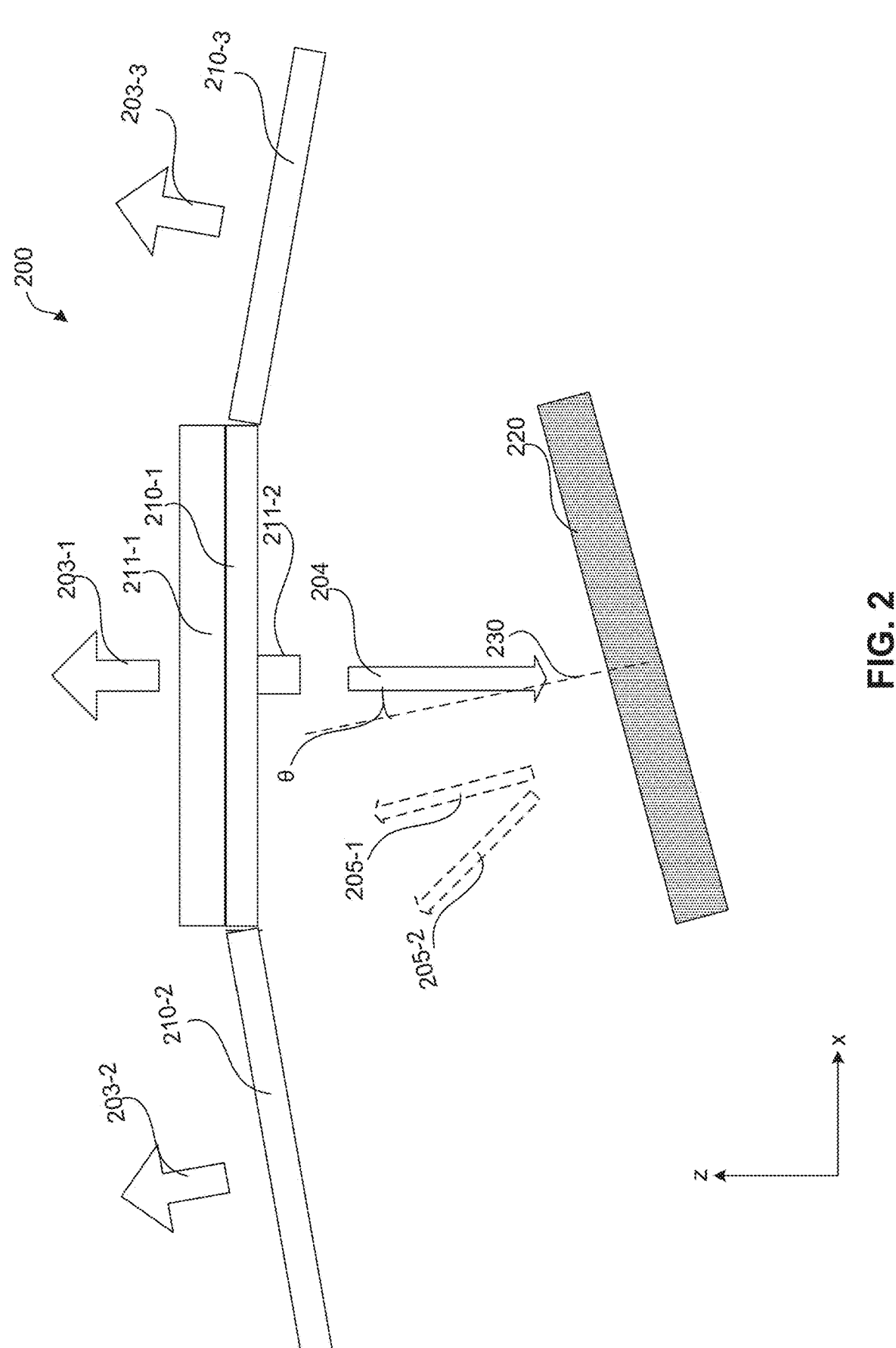
FIG. 2 illustrates an IMP apparatus, according to some embodiments of the present disclosure.

FIG. 2 illustrates an exemplary IMP apparatus 200, according to some embodiments of the present disclosure. IMP apparatus 200 can include an ion implanter 211 and an ion-collecting device 210. IMP apparatus 200 can be placed over a substrate 220. IMP apparatus 200 can generate an ion beam 204 that impinges on substrate 220 at a tilt angle $\theta$, where $\theta$ represents the angle between the direction of the ion beam and a surface normal 230 of substrate 220. Ion-collecting device 210 can collect secondary ions (e.g., ions ejected from substrate 220 as a result of the IMP process) and record the number, species, and distribution of the collected secondary ions in ion data 203. Ion data 203 can be sent to a control unit/device (not shown in FIG. 2) for analysis. Elements 205-1 and 205-2 each represents an ejected ion traveling at a different angle from surface normal 230. For ease of description, other ejected particles such as atoms and electrons, are not shown or described in the present disclosure.

Ion implanter 211 can include any suitable device that can be used for ion implantation. For example, ion implanter 211 can include a gas system, an ionizer, an extractor, an accelerator, a mass slit, an analyzer magnet, a corrector magnet, and a vacuum system. The gas system can provide gas particles (e.g., boron, phosphorus, phosphane, and arsine) that can be ionized for ion generation. The ionizer can generate ions from the gas particles in the gas system. The extractor can extract the ions from the ionizer to form a beamline. The accelerator can accelerate ions in the beamline to form ions with higher energy. The analyzer magnet and mass slit can select the desired species of ions with sufficient velocity so the accelerated ions can continue down the beamline, and the corrector magnet can correct the direction that the beamline is incident on the target. In some embodiments, the accelerator can be further configured to accelerate and focus ion beams outputted from the analyzer magnet. Ion implanter 211 can also include an ion scanner that scans a uniformly distributed ion beam across a target. For ease of illustration, ion implanter 211 is depicted as an element 211-1 connected with ion scanner 211-2, where element 211-1 represents other parts of ion implanter 211 besides ion scanner 211-2. Each of the above components of ion implanter 211 can be operated in a vacuum environment.

Ion-collecting device 210 can be placed at any suitable location that can receive ejected ions. At least one ion-collecting device 210 can be used to receive and record ejected ions traveling along different directions. For example, three ion-collecting device 210-1, 210-2, and 210-3 are shown in FIG. 2. In some embodiments, ion-collecting device 210-1 is placed above substrate 220 to receive ejected ions traveling along a smaller angle from surface normal 230, and ion-collecting devices 210-2 and 210-3 are placed adjacent to ion-collecting device 210-1 to receive ejected ions traveling along a greater angle from surface normal 230. For example, one or more ion-collecting devices 210 can be arranged to extend along the x direction (e.g., ion-collecting devices 210-2, 210-1, and 210-3) and/or along the y direction (e.g., perpendicular to the x-z plane). Ion scanner 211-2 can be placed between ion-collecting device 210-1 and substrate 220 so ion beam 204 is not blocked by ion-collecting device 210-1. In some embodiments, the shapes, surface areas, and/or positions of ion-collecting devices (e.g., 210-1, 210-2, and 210-3) are optimized to ensure a maximum number of ejected ions 205 are collected. For example, one or more ion-collecting device 210 can form a "dome" shape that captures and records a majority of the ejected ions 205. Ion-collecting device 210 can include any suitable device that collects and records ejected ions 205 in the form of data. In some embodiments, ion-collecting device 210 includes an atom probe device. An area formed by ion-collecting devices 210 (e.g., 210-1, 210-2, or 210-3) can be sufficiently large to collect and record a maximum number of ejected ions from substrate 220. In some embodiments, each ion-collecting device 210 has a sufficiently large area to collect ions ejected towards ion-collecting device 210. In some embodiments, ion-collecting device 210 collects and records the species, number, and distribution of all ejected ions 205. The distribution of ejected ions 205 can be recorded in the form of ion data 203, which can be transmitted from the one or more ion-collecting devices 210-1, 210-2, and 210-3 to a control device/unit for analysis of tilt angle deviation. For example, each ion-collecting device 210 can send respective ion data (e.g., 203-1, 203-2, and 203-3) to the control device/unit.

Figure 3:
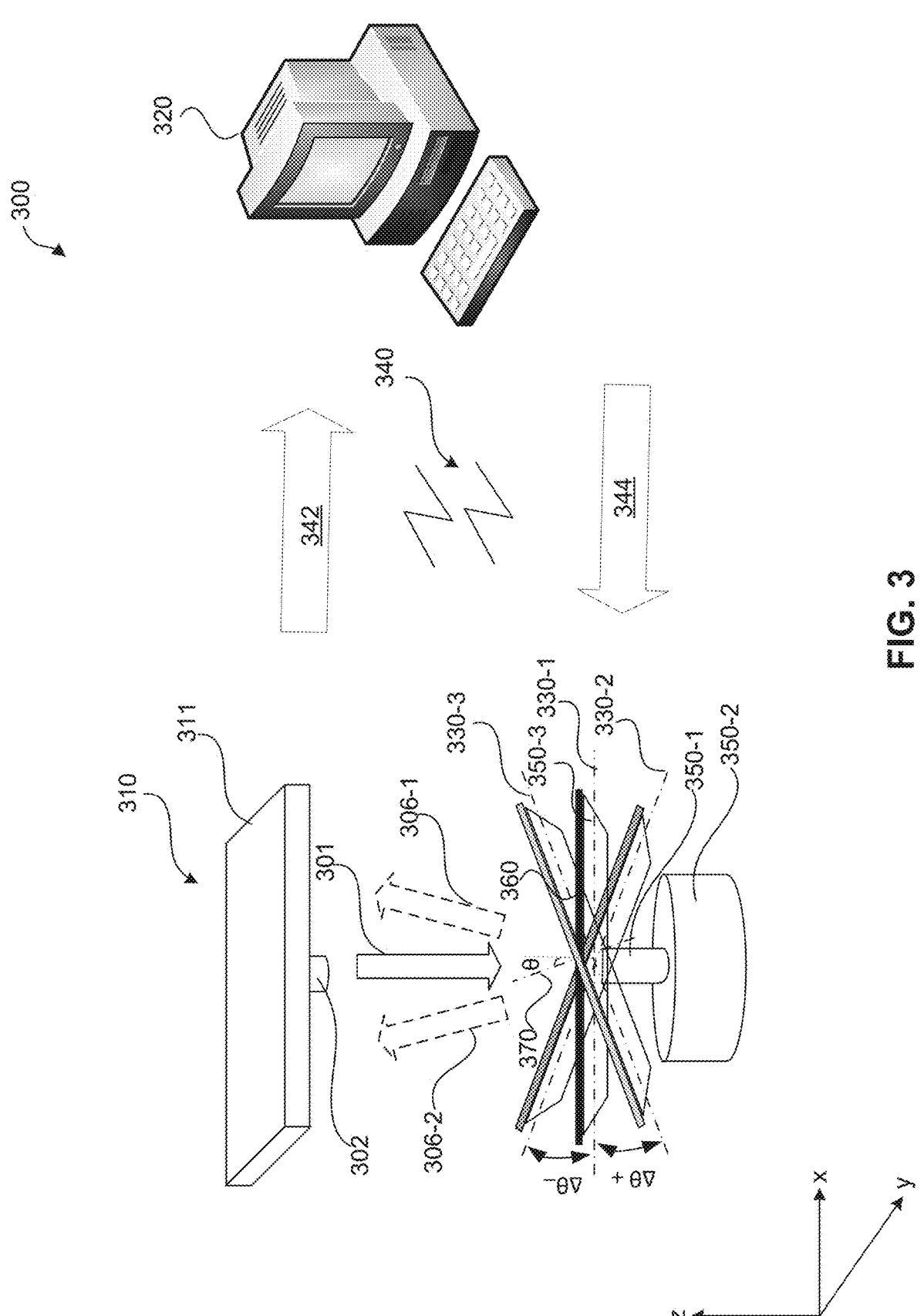
FIG. 3 illustrates an IMP system, according to some embodiments of the present disclosure.

FIG. 3 illustrates an exemplary IMP system 300, according to some embodiments. IMP 300 can include an IMP device 310, a control unit/device 320, a communication mechanism 340, and a tilting mechanism 350. A substrate 360 can be placed over tilting mechanism 350 under IMP device 310. IMP device 310 can scan ion beam 301 on substrate 360 at a tilt angle of $\theta$.

IMP device 310 can include an ion implanter and an ion-collecting device 311. The ion implanter can be similar to or the same as IMP apparatus 200 illustrated in FIG. 2. For case of illustration, the ion implanter is represented by an ion scanner 302 located between substrate 360 and ion-collecting device 311. Ion scanner 302 can scan/implant ion beam 301 on substrate 360, and ion-collecting device 311 can receive ejected ions 306-1 and 306-2 (e.g., secondary ions in various directions). Ion-collecting device 311 can also record ion data 342 that includes the distribution, species, and number of ejected ions 306-1 and 306-2. In some embodiments, the area of ion-collecting device 311 is sufficiently large to receive all the ejected ions (e.g., 306-1 and 306-2). Ion-collecting device 311 can transmit ion data 342 to control unit/device 320 for calculation of tilt angle deviation.

Control unit/device 320 can include any suitable computer system(s) that can calculate the tilt angle deviation based on ion data 342 transmitted by IMP device 310. Control unit/device 320 can be a part of IMP device 310 and/or tilting mechanism 350, or a separate device. For example, control unit/device 320 can include a micro-controller integrated with IMP device 310. Control unit/device 320 can determine a tilt angle control signal 344 that includes data and/or commands for adjusting tilt angle $\theta$. Control unit/device 320 can control the movement/rotation of tilting mechanism 350 based on tilt angle control signal 344. For example, control unit/device 320 can rotate tilting mechanism 350 about the y axis by an angle $\theta$ so ion beam 301 can be incident on substrate 360 at tilt angle $\theta$. Control unit/device 320 can also rotate tilting mechanism 350 about the y axis by a correction angle $\Delta\theta$ to adjust tilt angle $\theta$ so the number of ejected ions 306-1 and 306-2 and the number of channeling ions can be minimized. In some embodiments, rotating mechanism 350 carries substrate 360 to rotate for a desired range of angles, and ion-collecting device 311 collects and records the ejected ions at different angle sub-range of the range of angles as ion data 342. IMP device 310 can then transmit ion data 342 to control unit/device 320 for analysis and calculation of tilt angle deviation.

Correction angle $\Delta\theta$ can be determined based on the tilt angle deviation. Control unit/device 320 can send a tilt angle control signal 344 that includes data and commands for rotating tilting mechanism by correction angle $\Delta\theta$, which can be a positive value ($\Delta\theta_+$), zero, or a negative value ($\Delta\theta_-$). In some embodiments, tilt angle control signal 344 includes an adjusted tilt angle based on tilt angle $\theta$ and correction angle $\Delta\theta$. Control unit/device 320 can command tilting mechanism 350 to rotate about opposite directions for positive and negative correction angles $\Delta\theta$. In some embodiments, as shown in FIG. 3, tilting mechanism 350 rotates (e.g., along the y axis) clockwise when $\Delta\theta$ is a negative value ($\Delta\theta_-$) and rotates counterclockwise when $\Delta\theta$ is a positive value ($\Delta\theta_+$). In some embodiments, tilting mechanism 350 maintains the orientation of substrate 360 when correction angle $\Delta\theta$ is zero. After the correction, the adjusted tilt angle can be ($\theta-\Delta\theta_-$) or ($\theta+\theta_+$). In some embodiments, correction angle $\Delta\theta$ can be obtained by tilting substrate 360 so the angle between the direction of ion beam 301 and surface normal 370 can be ($\theta-\Delta\theta_-$) or ($\theta+\theta_+$). For example, as shown in FIG. 3, tilting mechanism 350 can tilt substrate 360 about the y axis by correction angle of $\Delta\theta$ so a top surface of substrate 360 (e.g., the surface where ion beam 301 is incident on) can have an angle of ($\theta-\Delta\theta_-$) or ($\theta+\theta_+$) with surface normal 370. Tilting mechanism 350 can rotate substrate 360 clockwise or counterclockwise about the y axis. Details of the calculation of the correction angle is described in FIG. 4.

Tilting mechanism 350 includes a moveable tilt stage 350-2, a load support portion 350-1, and a wafer/substrate holder 350-3. Moveable tilt stage 350-2 can receive a control signal (e.g., tilt angle control signal 344) from control unit/device 320 and tilt wafer/substrate holder 350-3 by a desired angle about the y axis through load support portion 350-1. In some embodiments, moveable tilt stage 350 includes or is connected to a driving device (not shown in FIG. 3) such as a motor and/or actuator to move wafer/substrate holder 350-3 based on the received control signal. Load support portion 350-1 can rigidly connect wafer/substrate holder 350-3 and moveable tilt stage 350-2 so moveable tilt stage 350-2 can drive wafer/substrate holder 350-3 to rotate/move by an angle commanded by the control signal. Wafer/substrate holder 350-3 can be used to fix substrate 360 for the IMP process so the relative positions between substrate 360 and wafer/substrate holder 350-3 can be unchanged/stable during the IMP process. Ion beam 301 can thus impinge on a desired area during the IMP process.

Communication mechanism 340 can include any suitable wired or wireless communication methods such as a local area network (LAN) and/or a WiFi network that facilitate communication (e.g., transmission of signals and/or data) between ion implantation device 310 and control unit/device 320, and between control unit/device 320 and tilting mechanism 350.

In an exemplary IMP process, control unit/device 320 stores a recipe for an IMP process. The recipes can contain data, such as the ion beam flux and the tilt angle. In some embodiments, control unit/device 320 executes the recipe to perform the IMP process. Control unit/device 320 can send data/control signals reflecting the ion beam flux and tilt angle to IMP device 310 and tilting mechanism 350. Accordingly, IMP device 310 can scan ion beam 301 through ion scanner 302 at an ion beam flux based on the recipe, and tilting mechanism 350 can rotate substrate 360 so tilt angle θ can be formed between ion mean 301 and the surface normal 370 of substrate 360.

Ion-collecting device 311 can collect and record ejected ions from substrate 360 during the IMP process. The distribution of the ejected ions can be recorded and stored in ion-collecting device 311 in the form of ion data 342 and transmitted to control unit/device 320. Ion data 342 can be used for the calculation of the dosage of dopants (e.g., the number of ions doped and/or ejected) and tilt angle deviation of ion beam 301. For example, ion data 342 can include the location of each ejected ion on ion-collecting device 311 and the number of the ejected ions. Control unit/device 320 can extract dosage of ions doped in substrate 360 and/or tilt angle deviation from the data. In some embodiments, control unit/device 320 includes suitable software and hardware for performing calculation and analysis for calculation of dosage and tilt angle deviation from ion data 342. Subsequently, control unit/device 320 can generate tilt angle control signal 344 that includes adjusted tilt angle θ and correction angle Δθ to control tilting mechanism 350 to rotate/move substrate 360 by to the adjusted tilt angle. The number of ejected ions collected and recorded by ion-collecting device 311 and the number of channeling ions can be minimized.

In some embodiments, the adjustment of tilt angle θ can include a loop process. For example, control unit/device 320 can continue to adjust tilt angle θ based on ion data 342 until a minimum number of ejected ions are collected and recorded. In some embodiments, the IMP condition with the minimum number of ejected ions can be recorded in control unit/device 320 as an optimized recipe and can be used for IMP processes of subsequent targets.

Figures 4A, 4B:
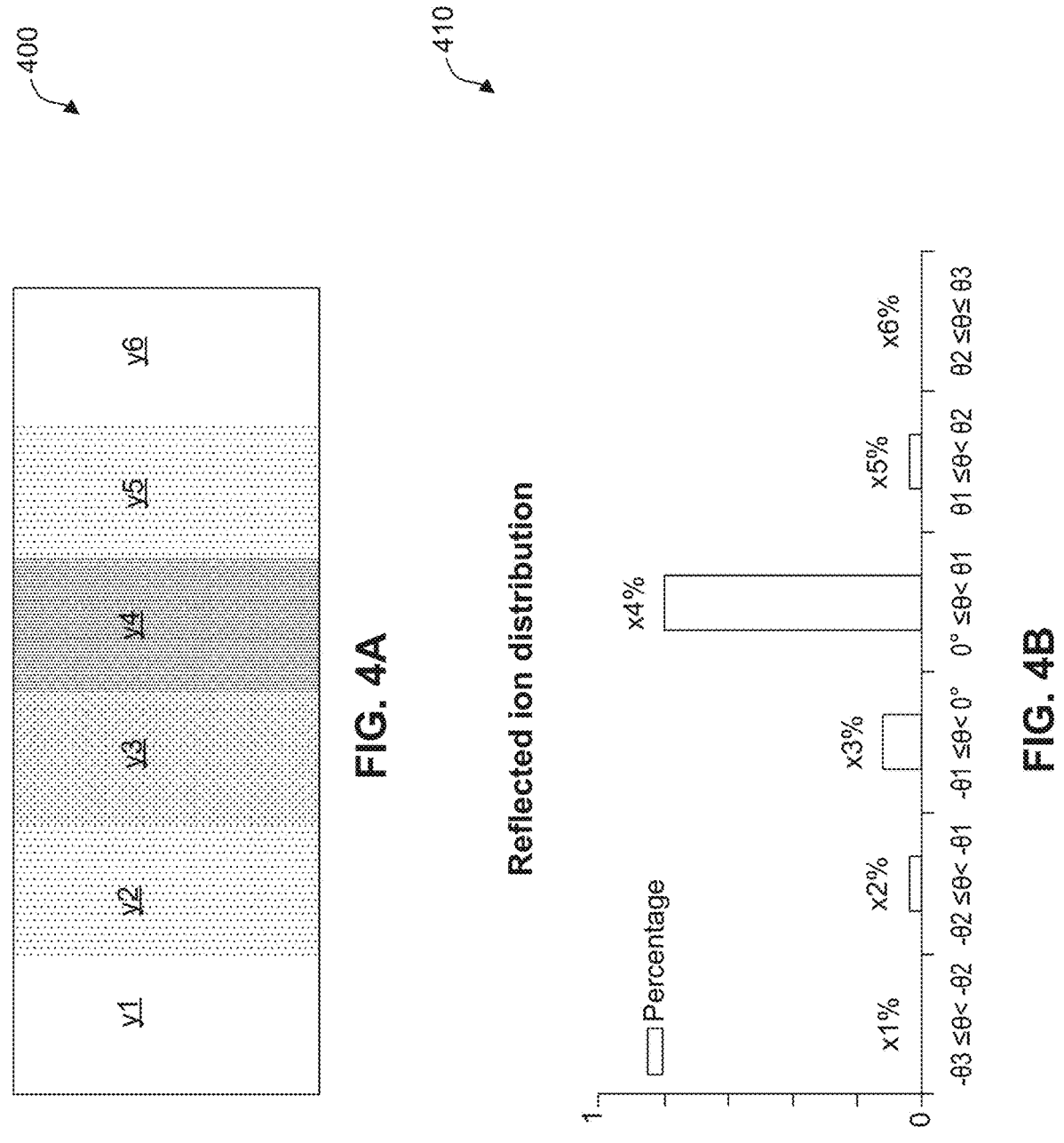
FIG. 4A illustrates an ion distribution recorded by the ion implantation system, according to some embodiments of the present disclosure.
FIG. 4B illustrates a histogram of the ion distribution of FIG. 4A.

FIGS. 4A and 4B illustrate an exemplary method to calculate the correction angle based on a distribution of different ejected ions recorded by an ion-collecting device over a range of angles, according to some embodiments. FIG. 4A illustrates an exemplary top view 400 of the ejected ions recorded by the ion-collecting device, and FIG. 4B illustrates an exemplary histogram 410 of the percentage of collected ejected ions in each angle sub-range illustrated in FIG. 4A.

As shown in FIG. 4A, an IMP device (similar to or the same as IMP device 310) can scan an ion beam (similar to or the same as ion beam 301) on a target (similar to or the same as substrate 360) over a range of angles. For example, the range of angles can be from about −θ3 to about θ3, where θ3 represents an angle value. The positive and negative signs represent opposite directions about the surface normal of the target. For example, the IMP device can scan from −θ3 towards 0°, and from 0° towards θ3. In some embodiments, the range of angles is divided into six angle sub-ranges [−θ3, θ2), [−θ2, −θ1), [−θ1, 0), [0, θ1), [θ1, θ2), and [θ2, θ3). As the IMP device scans in each angle sub-range, the ion-collecting device can collect and record the ejected ions. Regions y1, y2, y3, y4, y5, and y6 represent, e.g., the distribution and number (or dosage) of ejected ions collected by the ion-collecting device at the respective angle sub-range. For example, y1 represents the distribution and number of ejected ions when angle sub-range [−θ3, θ2) is scanned, y2 represents the distribution and number of ejected ions when angle sub-range [−θ2, θ1) is scanned, and so on. The total number of ejected ions (e.g., of regions y1-y6) can be calculated and recorded as Y. A percentage of the ejected ions in each angle sub-range over the total number of ejected ions can be calculated as yi/Y× 100%=xi% (i=1, 2, . . . , 6), and can be depicted in a histogram 410 of FIG. 4B. Histogram 410 can reflect the number and distribution of ejected ions in each angle sub-range.

In some embodiments, correction angle Δθ can be calculated as a weighted sum of the average angle in the angle sub-ranges. For example, the average angle in an angle sub-range can be (θi+θ(i−1))/2. Accordingly, correction angle Δθ can be calculated as ((−θ3)+(−θ2))/2×x1%+((−θ2)+(−θ01))/2×x2%+((−θ1)+)/2×x3%+(0+(θ1))/2×x4%+((θ1)+(θ2))/2×x5%+((θ2)+(θ3))/2×x6%. In some embodiments, θ3 is equal to the largest angle (e.g., maximum angle) that can be scanned by the IMP device in an IMP process. In some embodiments, θ3 is equal to about 15°.

In some embodiments, Δθ is used to adjust the tilt angle in a current IMP process. For example, the transmission of ion data (same as or similar to ion data 342) and tilt angle control signal (same as or similar to tilt angle control signal 344) can be in real-time so the control unit/device can adjust tilt angle θ by correction angle Δθ after scanning the ion beam over the range of angles. In some embodiments, Δθ is used to adjust the tilt angle in a similar subsequent IMP process. For example, when another target similar to or the same as the current target (e.g., the target used for the Δθ calculation) undergoes an IMP process, Δθ can be used to adjust the tilt angle of a recipe. In some embodiments, if Δθ is negative, the adjusted tilt angle can be (θ−Δθ) and the control unit/device (similar to or the same as control unit/device 320) can rotate the tilting mechanism to reduce tilt angle θ by Δθ; and if Δθ is positive, the adjusted tilt angle can be (θ+Δθ) and the control unit/device can rotate the tilting mechanism to increase tilt angle θ by Δθ. In some embodiments, if Δθ is zero, the adjusted tilt angle is still θ and the tilting mechanism maintains the orientation of the substrate (same as or similar to substrate 360). In some embodiments, the number of angle sub-ranges is determined flexibly, e.g., based on the range of angles and/or the control precision of tilt angle θ. In some embodiments, the IMP device automatically adjusts the ion dosage when the tilt angle is replaced by the adjusted tilt angle. For example, a look-up table describing a correlation between a tilt angle and an ion dosage can be stored in the control unit/device. The control unit/device can automatically adjust the ion dosage to ensure the dopant concentration meets the recipe requirement.

Figure 5:
FIG. 5 illustrates a method for performing an IMP process, according to some embodiments of the present disclosure.
Figure 5:
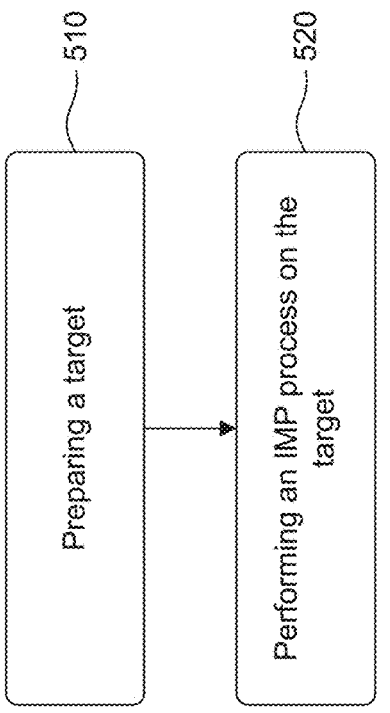

FIG. 5 illustrates an exemplary process 500 to perform an IMP process, according to some embodiment. As shown in FIG. 5, at the beginning of process 500, at operation 510, a target is prepared for the IMP process, where the target can include a substrate. The substrate can include one or more patterned device structures or device layers (e.g. structures or layers for transistors). A film can be further deposited on the substrate. In some embodiments, the film can also be used as a sample for analysis and calculation of a correction angle for the same material. For example, an amorphous silicon film of a desired thickness can be deposited over a crystalline silicon substrate. At operation 520, the control unit/device can execute a recipe and control an IMP device to perform an IMP process on the target. In some embodiments, the IMP process can include generating an ion beam to irradiate one or more regions of the target at a tilt angle. In some embodiments, the control unit/device can execute the recipe to instruct the IMP device to conduct the IMP process.

Figure 6:
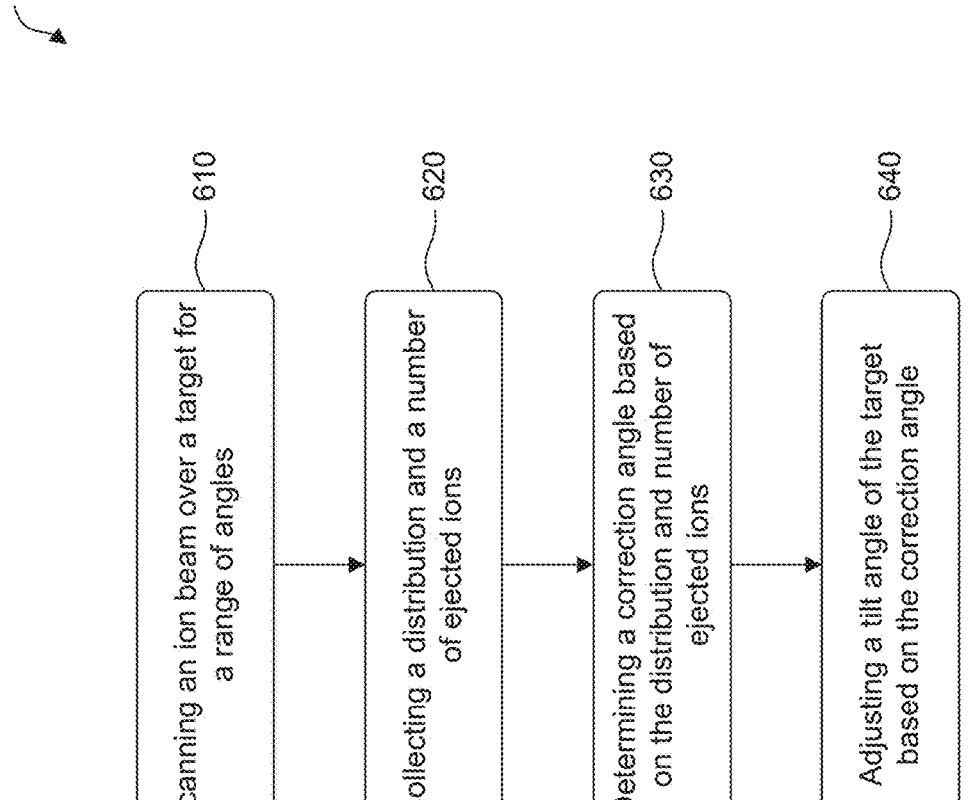
FIG. 6 illustrates a method for optimizing IMP parameters, according to some embodiments of the present disclosure.

FIG. 6 illustrates an exemplary process 600 to generate and use the correction angle to adjust the tilt angle for the IMP process over the target, according to some embodiments. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 6. In some implementations, one or more other operations may be performed in addition to or in place of the presently described operations.

At operation 610, the IMP device can scan the ion beam over the target for a range of angles. In some embodiments, the IMP device can scan the ion beam over an other target for the range of angles, where the other target can have similar device structures, device layers and substrate as the target. The scanning of ion beam can include scanning multiple angle sub-ranges within the range of angles.

At operation 620, the IMP device can collect a distribution and a number of ejected ions from the ion beam scan over the target. An ion data, including the collected distribution and number of eject ions of each angle sub-range of the angle range scanned by the IMP device, is transmitted to a control unit/device. In some embodiments, other ion data, such as species or kinetic energies of ejected ions, collected by the IMP device is transmitted to the control unit/device.

At operation 630, the control unit/device can determine a correction angle for the target based on the distribution and number of ejected ions. For example, the correction angle can be determined by calculating a weighted sum of average angles of the multiple angle sub-ranges based on multiple weights, where each average angle of the respective angle sub-range can be a midpoint angle within the respective angle sub-range and each of the multiple weights of the respective angle sub-range can be calculated from a percentage of ions distributed in the respective angle sub-range over a total number of ions distributed in the range of angles. The details of determining the correction angle can be found using the method illustrated in FIG. 4. In some embodiments, the determination of the correction angle can also be based on other collected ion data, such as species or kinetics energies of ejected ions. In some embodiments, a pattern recognition process is performed to extract data of the distribution and number of ejected ions from the received ion data to determine the correction angle. Different algorithm and/or methods can also be used to determine the correction angle. For example, the methods can include a linear algebra process, an analysis of various (ANOVA) process, and/or a machine learning process.

At operation 640, the control unit/device can adjust the tilt angle based on the correction angle. For example, the adjustment of the tilt angle can include adding the correction angle to the tilt angle if the correction angle is a positive value, or subtracting the correction angle from the tilt angle if the correction angle is a negative value. In some embodiments, an adjusted tilt angle is equal to the sum of the tilt angle and the correction angle if the adjustment of the tilt angle is to add the correction angle to the tilt angle. In some embodiments, the adjusted tilt angle is equal to the difference of the tilt angle and the correction angle if the adjustment of the tilt angle is to subtract the correction angle from the tilt angle. The control unit/device can further command the tilting mechanism to rotate the target so an angle between the ion beam and the target surface can be the adjusted tilt angle. In some embodiments, methods described in FIGS. 3 and 4 can be employed to rotate the tilting mechanism.

Embodiments of the present disclosure can include the use of a calibration wafer as the target to adjust the tilt angle. The calibration wafer can be a substrate used for IMP device test or adjustment purposes and replaced with a production wafer (e.g., a wafer with devices formed thereon and intended for integrated circuit packaging) after completion of the IMP device test/adjustment. In some embodiments, the calibration wafer can have the same or similar device structures, device layers, and substrate as the production wafer.

For example, in operation 610, the target can be the calibration wafer. After performing operations 610-640 with the calibration wafer, the calibration wafer can be replaced with the production wafer for the IMP process based on the adjusted tilt angle. For example, the production wafers can be irradiated with the ion beam using the adjusted tilt angle. After a predetermined number of production wafers have been processed by the IMP device, the calibration wafer (e.g., either the same calibration wafer used previously or a different calibration wafer) can be used to re-adjust the adjusted tilt angle based on operations 610-640 of method 600.

A benefit, among others, of using the calibration wafer is that the IMP device can be calibrated with an optimized tilt angle prior to conducting the IMP process on production wafers. This way, the production wafer is manufactured with an optimized tilt angle at the beginning of production, resulting in improved device performance.

Figure 7:
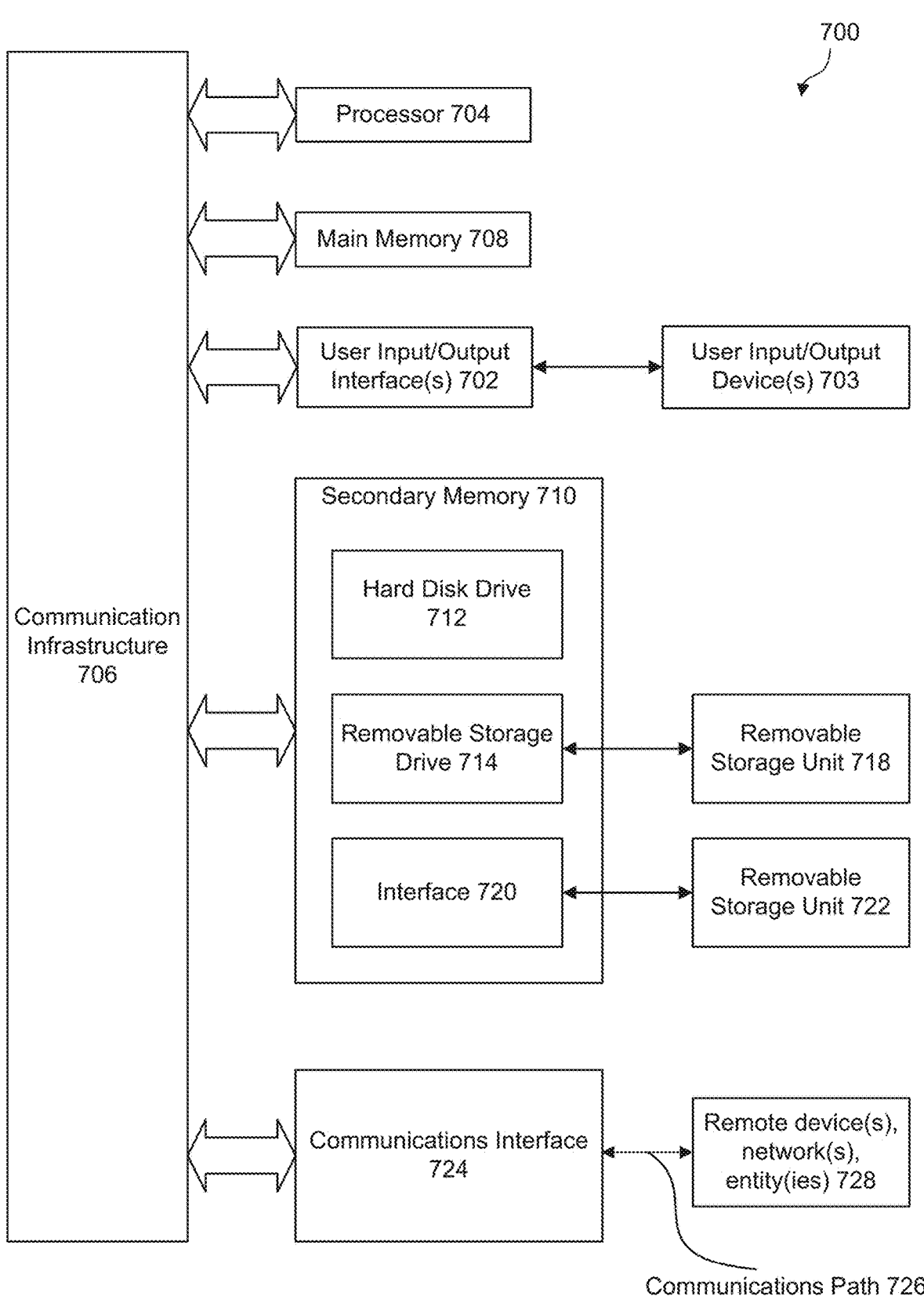
FIG. 7 illustrates an exemplary computer system for implementing various embodiments of the present disclosure.

FIG. 7 is an illustration of an example computer system 700 in which various embodiments of the present disclosure can be implemented, according to some embodiments. Computer system 700 can be used in the control unit/device, as described above. Computer system 700 can be any well-known computer capable of performing the functions and operations described herein. For example, and without limitation, computer system 700 can be capable of analyzing data, and processing and transmitting signals. Computer system 700 can be used, for example, to execute an IMP process, and collect and analyze ion data from the IMP process.

Computer system 700 includes one or more processors (also called central processing units, MCUs, or CPUs), such as a processor 704. Processor 704 is connected to a communication infrastructure or bus 706. Computer system 700 also includes input/output device(s) 703, such as monitors, keyboards, pointing devices, etc., that communicate with communication infrastructure or bus 706 through input/output interface(s) 702. A control tool can receive instructions to implement functions and operations described herein—e.g., the functions of system 300 described in FIG. 3 and the method/process described in FIGS. 4-6—via input/output device(s) 703. Computer system 700 also includes a main or primary memory 708, such as random access memory (RAM). Main memory 708 can include one or more levels of cache. Main memory 708 has stored therein control logic (e.g., computer software) and/or data. In some embodiments, the control logic (e.g., computer software) and/or data can include one or more of the functions described above with respect to the wet bench structure.

Computer system 700 can also include one or more secondary storage devices or memory 710. Secondary memory 710 can include, for example, a hard disk drive 712 and/or a removable storage device or drive 714. Removable storage drive 714 can be a floppy disk drive, a magnetic tape drive, a compact disk drive, an optical storage device, tape backup device, and/or any other storage device/drive.

Removable storage drive 714 can interact with a removable storage unit 718. Removable storage unit 718 includes a computer usable or readable storage device having stored thereon computer software (control logic) and/or data. Removable storage unit 718 can be a floppy disk, magnetic tape, compact disk, DVD, optical storage disk, and/any other computer data storage device. Removable storage drive 714 reads from and/or writes to removable storage unit 718 in a well-known manner.

According to some embodiments, secondary memory 710 can include other mechanisms, instrumentalities or other approaches for allowing computer programs and/or other instructions and/or data to be accessed by computer system 700. Such mechanisms, instrumentalities or other approaches can include, for example, a removable storage unit 722 and an interface 720. Examples of the removable storage unit 722 and the interface 720 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 710, removable storage unit 718, and/or removable storage unit 722 can include one or more of the functions described above with respect to the wet bench structure.

Computer system 700 can further include a communication or network interface 724. Communication interface 724 enables computer system 700 to communicate and interact with any combination of remote devices, remote networks, remote entities, etc. (individually and collectively referenced by reference number 728). For example, communication interface 724 can allow computer system 700 to communicate with remote devices 728 over communications path 726, which can be wired and/or wireless, and which can include any combination of LANs, WANs, the Internet, etc. Control logic and/or data can be transmitted to and from computer system 700 via communication path 726.

The functions/operations in the preceding embodiments can be implemented in a wide variety of configurations and architectures. Therefore, some or all of the operations in the preceding embodiments—e.g., the functions of system 300 described in FIG. 3 and the method/process described in FIGS. 4-6—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 700, main memory 708, secondary memory 710 and removable storage units 718 and 722, as well as tangible articles of manufacture embodying any combination of the foregoing. Such control logic, when executed by one or more data processing devices (such as computer system 700), causes such data processing devices to operate as described herein. For example, the hardware/equipment can be connected to or be part of clement 728 (remote device(s), network(s), entity (ies) 728) of computer system 700.

In some embodiments, a system for an ion implantation (IMP) process includes an ion implanter configured to scan an ion beam over a target for a range of angles, a tilting mechanism configured to support and tilt the target, an ion-collecting device configured to collect a distribution and a number of ejected ions from the ion beam scan over the target, and a control unit configured to adjust a tilt angle based on a correction angle determined based on the distribution and number of ejected ions.

In some embodiments, a method for an ion implantation (IMP) process includes scanning an ion beam over a target for a range of angles, collecting a distribution and a number of ejected ions from the ion beam scan over the target, determining a correction angle based on the distribution and number of ejected ions, and adjusting a tilt angle of the target based on the correction angle.

In some embodiments, a method for an ion implantation (IMP) process includes scanning an ion beam over a first target for a range of angles, determining a correction angle based on a distribution and a number of ejected ions from the ion beam over the first target, adjusting a tilt angle of the first target based on the correction angle, and irradiating a second target with the ion beam at the adjusted tilt angle.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
    scanning a target with an ion beam, wherein the target is disposed on a moveable tilt stage;
    collecting ion data comprising a distribution and a number of ejected ions from the target;
    determining a correction angle based on the ion data; and
    adjusting a tilt angle of the moveable tilt stage based on the correction angle.

2. The method of claim 1, further comprising scanning the target with the ion beam at a range of angles.

3. The method of claim 2, further comprising scanning the ion beam over the target for a plurality of angle sub-ranges within the range of angles.

4. The method of claim 2, further comprising determining the correction angle based on a weighted sum of a percentage of ions distributed in the range of angles and an average angle of the range of angles.

5. The method of claim 2, further comprising adjusting an ion implantation depth.

6. The method of claim 1, further comprising determining a species of the ejected ions.

7. The method of claim 1, further comprising communicating to the moveable tilt stage, a control signal comprising data and commands for adjusting the tilt angle.

8. The method of claim 1, wherein adjusting a tilt angle comprises adjusting the tilt angle based on the ion data until a minimum number of the ejected ions are collected and recorded.

9. The method of claim 1, further comprising adding the correction angle to the tilt angle in response to the correction angle being a positive value.

10. The method of claim 1, further comprising subtracting the correction angle from the tilt angle in response to the correction angle being a negative value.

11. A method, comprising:

implanting ions into a target;

collecting ejected ions from the target;

determining a correction angle based on a distribution and a number of collected ions; and determining an adjusted dosage of the ions and an adjusted tilt angle for the target.

12. The method of claim 11, further comprising determining a distribution, a species, and a number of the ejected ions from the target.

13. The method of claim 11, further comprising adjusting the tilt angle of the target based on the correction angle.

14. The method of claim 11, further comprising adjusting an ion implantation depth.

15. The method of claim 11, further comprising irradiating a second target with an ion beam at the adjusted tilt angle.

16. A method, comprising:
implanting ions into a target;
collecting ion data comprising a distribution and a number of ejected ions from the target;
determining, based on the distribution and the number of the ejected ions, an adjusted dosage of the ions and a correction angle for the target; and
adjusting the target based on the correction angle.

17. The method of claim 16, wherein adjusting the target based on the correction angle comprises adjusting a tilt angle of the target.

18. The method of claim 17, wherein adjusting the tilt angle comprises adjusting the tilt angle based on the ion data until a minimum number of the ejected ions are collected and recorded.

19. The method of claim 16, further comprising adjusting an ion implantation depth.

20. The method of claim 16, further comprising determining a species of the ejected ions.

* * * * *